(12) United States Patent
Simon

(10) Patent No.: US 7,782,065 B2
(45) Date of Patent: Aug. 24, 2010

(54) METHOD OF CALIBRATING A NETWORK ANALYZER

(75) Inventor: Hans-Joachim Simon, Wolfratshausen (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 1376 days.

(21) Appl. No.: 11/218,300

(22) Filed: Sep. 1, 2005

(65) Prior Publication Data

US 2006/0043978 A1 Mar. 2, 2006

(30) Foreign Application Priority Data

Sep. 1, 2004 (DE) .................. 10 2004 042 323
Feb. 3, 2005 (DE) .................. 10 2005 005 056

(51) Int. Cl.
*G01R 35/00* (2006.01)
(52) U.S. Cl. ........................................ 324/601
(58) Field of Classification Search .................. 324/601
See application file for complete search history.

(56) References Cited

U.S. PATENT DOCUMENTS

| 4,982,164 | A | * | 1/1991 | Schiek et al. ............... 324/638 |
| 5,666,059 | A | * | 9/1997 | Heuermann et al. .......... 324/601 |
| 6,853,198 | B2 | * | 2/2005 | Boudiaf et al. ............... 324/601 |

FOREIGN PATENT DOCUMENTS

| DE | 39 12 795 A1 | 11/1989 |
| DE | 41 25 624 A1 | 6/1992 |
| DE | 44 33 375 A1 | 4/1995 |
| DE | 44 35 559 A1 | 4/1996 |
| DE | 199 18 960 A1 | 11/1999 |
| DE | 102 35 221 A1 | 2/2004 |
| DE | 102 42 932 A1 | 3/2004 |

OTHER PUBLICATIONS

Kruppa, W. et al, An Explicit Solution fo the Scattering Parameters of a Linear Two-Port Measures with an Imperfect Test Set, IEEE T-MTT, Jan. 1971, pp. 122-123.

Engen, G. et al, Thru-Reflect-Line: An improved Technique for Calibrating the Dual Six-Port Automatic Network Analyzer, IEEE T-MTT, Dec. 1979, pp. 987-993.

(Continued)

*Primary Examiner*—Amy He
(74) *Attorney, Agent, or Firm*—Ditthavong Mori & Steiner, P.C.

(57) ABSTRACT

A method for calibrating a network analyzer having at least two test ports is described in which a completely known, transmitting first calibration standard, is designed as a two-port standard and is connected between two test ports of the network analyzer, is measured. Also measured is a second calibration standard that is designed as a two-port standard or a double one-port standard and is connected between the same test ports of the network analyzer, of which only the reflection parameters are known. Measured too is a third calibration standard, symmetrical with regard to its reflection parameters and designed as a two-port standard or a double one-port standard and is connected between the same test ports of the network analyzer. From results of these measurements, the matrix elements of error two-ports assigned to the test ports are calculated.

4 Claims, 2 Drawing Sheets

OTHER PUBLICATIONS

Eul H.-J. et al., Thru-Match-Reflect: One Result of a Rigorous Theory for De-Embedding and Network Analyzer Calibration, Proc. 18*th* European Microwave Conference, Stockholm, 1988, pp. 909-914.

English Translation of German Search report for German patent Application No. 10 2005 005 056.5, dated Feb. 3, 2005.

German Search report for German patent Application No. 10 2005 005 056.5, dated Feb. 3, 2005.

Schiek, B., Grundlagen der Systemfehlerkorrektur von Netzwekanaylsatoren, Chapter 4.2 to 4.5, dated Aug. 28, 1987.

\* cited by examiner

METHOD OF CALIBRATING A NETWORK ANALYZER

RELATED APPLICATIONS

The present invention claims the benefit of German patent applications DE 10 2004 042 323.7, filed Sep. 1, 2004, and DE 10 2005 005 056.5, filed Feb. 3, 2005, the contents of which are incorporated by reference in their entirety.

FIELD OF THE INVENTION

The invention relates to a method of calibrating a network analyzer.

BACKGROUND OF THE INVENTION

A variety of methods are known for calibrating network analyzers, for example from German laid-open patent applications DE 44 33 375 A1, DE 39 12 795 A1 and DE 102 42 932 A1. German laid-open patent applications DE 102 35 221 A1 and DE 199 18 960 A1 describe a method for calibrating a network analyzer with more than two measuring ports.

In practice, the calibration method according to the 10-term model for network analyzers with three measuring receivers and the method based on the 7-term model which, however, uses a network analyzer with four measuring receivers, have become established. In these methods, two measuring ports of the network analyzer are connected to three different standards of which various parameters are known. In the previously used 7-term method, however, the requirement was made that both the first and second standards were ideally matched, i.e. that their reflection factors were equal to zero. This limitation is substantial and implies a significant reduction in the standards that are available.

SUMMARY OF THE INVENTION

A need therefore exists for an improved calibration method for network analyzers on the basis of the 7-term model whereby it is permitted for the first standard and the second standard to be mismatched.

This and other needs are addressed by embodiments and features of the present inventions. For a method in accordance with one embodiment of the invention, only the first standard need be fully known and that it has a transmitting property, i.e. that the two test ports must not be completely isolated from each other. For the second standard, only its reflection parameters need be known. For the third standard, it is required only that it is symmetrical with regard to its reflection parameters (reflection symmetry).

In various embodiments of the invention, the unknown scattering parameters of the second standard and the unknown reflection parameters of the third standard can be calculated. Furthermore, the method can be extended from a 2-port network analyzer to an n-port network analyzer with more than two test ports.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

A system, method, and software for calibrating a network analyzer are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

The method according to the invention relates to the calibration of network analyzers with two or more ports. Network analyzers are used for measuring the scattering parameters of two-port or multiport networks. Scattering parameters S are defined as quotients of wave quantities on feeding a generator signal to a port of the device under test and the non-reflecting termination of both ports. An ideal network analyzer for two-port measurement has matched test ports and three or four measuring receivers, from which each supplies the exact quantity of a wave traveling to the device under test or coming from it.

A setup of this type is not, however, realizable in practice in broadband form. The non-idealities, insofar as they are systematic and therefore reproducible, may be described with a system error model according to FIG. 1. The real network analyzer NA is thereby modeled in that error two-ports, designated G and H here, are connected in series with the test ports MT of an ideal network analyzer INA. For completely system error-corrected measurements of two-port networks, two different error models have become established.

Figure 2:
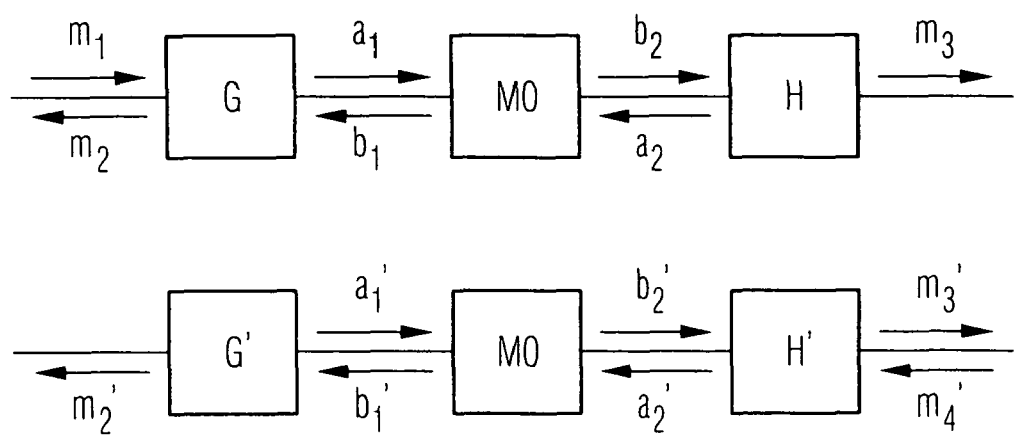
FIG. 2 shows the 10-term system error model for two-port measurement.

Firstly, for network analyzers with 3 measuring receivers, there is the 10-term model according to FIG. 2 whereby completely independent error models with 5 terms each are established for measuring in the forwards and backwards directions. This is known from W. Kruppa, K. Sodomsky: "An Explicit Solution for the Scattering Parameters of a Linear Two-Port Measured with an Imperfect Test Set", IEEE T-MTT, January 1971, pp. 122-123. In this case, the error two-port of the source measuring port to which the measuring signal is fed contains 3 terms and that of the load measuring port contains 2. The error two-ports for the backwards direction are designated G' and H'. For each measuring direction, only 3 measured quantities mi are available in each case.

Figure 3:
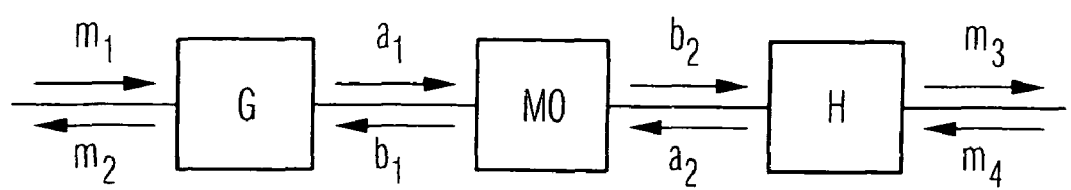
FIG. 3 shows the 7-term system error model for two-port measurement.
Figure 4:
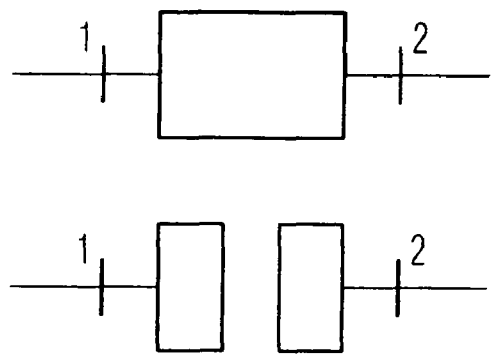
FIG. 4 shows the realization possibilities for the second and third calibration standard.

The 7-term model according to FIG. 3 can be used with network analyzers having 4 measuring receivers. In this case, all 4 measured quantities mi are detected for each measuring direction. of the actual 8 parameters of the system error two-ports, one falls away through normalization. The class of the 7-term calibration methods is based on the 7-term model, to which belong, for example, the TRL method, published in G. F. Engen, C. A. Hoer: "Thru-Reflect-Line: An Improved Technique for Calibrating the Dual Six-Port Automatic Network Analyzer", IEEE T-MTT, December 1979, pp. 987-993, the TRM method, TNA published in H.-J. Eul, B. Schiek: "Thru-Match-Reflect: One Result of a Rigorous Theory for De-Embedding and Network Analyzer Calibration", Proc. 18th EuMC, 1988, pp. 909-914 (referred to below as [Eul, Schiek]), or the family of LNN methods or LRR methods according to DE 39 12 795 A1. These methods have the advantage compared with that for the 10-term model that instead of 4 types of calibration standard, as a minimum only three calibration standards (referred to below merely as "standards") are required and that in addition, fewer properties of the standards have to be assumed to be known. The first calibration standard ST1, the second calibration standard ST2 and the third calibration standard ST3 are connected in that order as standardized devices under test MO between the measuring ports MT of the network analyzer. Whilst the 10-term method requires that the scattering parameters of all the standards are known a priori, in the 7-term method with 3 standards, only the first standard, a transmitting two-port, has to be completely known. The second may have two unknown parameters and the third three. The second and third standards may be designed, as shown in FIG. 4, as a two-port or as two one-ports.

In the previously known 7-term methods, the requirement also exists that both the first standard ST1 and the second standard ST2 are ideally matched, i.e. that their reflection factor is zero. This limitation is lifted by the method according to the invention. Both the first standard ST1 and the second standard ST2 may be mismatched and reflection symmetry is not required. The reflection factors of the first and second standards ST1, ST2 are taken to be known, as before.

The method according to the invention is based on self-calibration of the second standard ST2 and the third standard ST3, that is determination of the a priori unknown scattering parameters. When these parameters have been determined, system error correction is carried out according to the previously known scheme for 7-term methods with 3 standards—see [Eul, Schiek].

Figure 1:
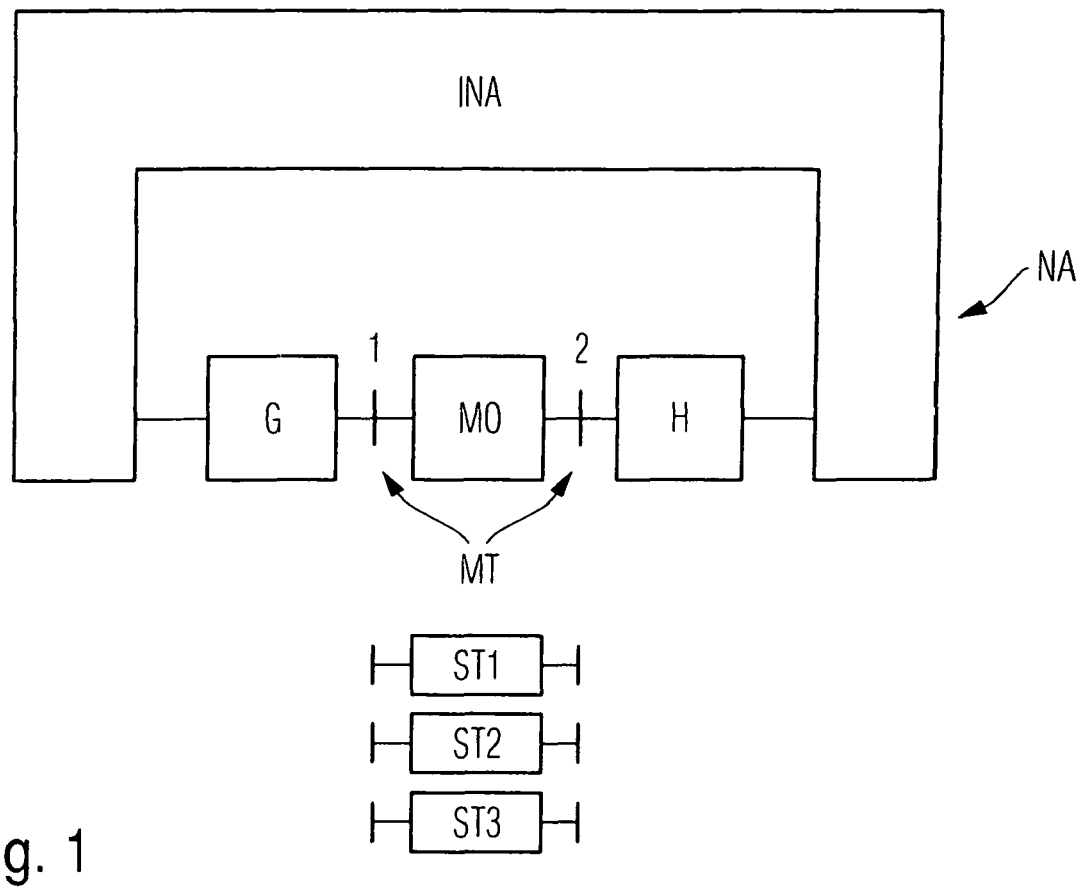
FIG. 1 shows the modeling of the non-idealities of a real network analyzer by means of system error two-ports.

Based on the known approach of [Eul, Schiek], the two system error two-ports of the 7-term model can be described, in accordance with FIG. 1, by matrices as follows:

$$\begin{pmatrix} b_1 \\ a_1 \end{pmatrix} = \begin{pmatrix} G_{11} & G_{12} \\ G_{21} & G_{22} \end{pmatrix} \begin{pmatrix} m_1 \\ m_2 \end{pmatrix} \quad (1)$$

$$\begin{pmatrix} a_2 \\ b_2 \end{pmatrix} = \begin{pmatrix} H_{11} & H_{12} \\ 1 & H_{22} \end{pmatrix} \begin{pmatrix} m_3 \\ m_4 \end{pmatrix} \quad (2)$$

Applying the chain transfer matrix N of the device under test, (1) and (2) lead to $$\begin{pmatrix} m_1 \\ m_2 \end{pmatrix} = G^{-1} N H \begin{pmatrix} m_3 \\ m_4 \end{pmatrix} \quad (3)$$

For each of the two feed directions of the device under test, an equation like (3) may be drawn up and then consolidated to give $$\begin{pmatrix} m_1 & m_1' \\ m_2 & m_2' \end{pmatrix} \begin{pmatrix} m_3 & m_3' \\ m_4 & m_4' \end{pmatrix}^{-1} = G^{-1} N H \text{ or } M = G^{-1} N H \text{ where} \quad (4)$$

$$M = \begin{pmatrix} m_1 & m_1' \\ m_2 & m_2' \end{pmatrix} \begin{pmatrix} m_3 & m_3' \\ m_4 & m_4' \end{pmatrix}^{-1} = m_a m_b^{-1} \quad (5)$$

For feeding through the test port 1, the measured quantities $m_i$ are given without a prime and for feeding through the test port 2, the measured quantities $m'_i$ are given with a prime.

For non-transmitting standards, the chain transfer matrix N does not exist and $m_b$ in (5) is singular, so that (4) and (5) must be modified for this case. For this purpose, the determinant $m_x$, of the matrix $m_b$ is extracted from (5). With $$\tilde{m}_b^T = \begin{pmatrix} m_4' & -m_3' \\ -m_4 & m_3 \end{pmatrix}$$

Equation (5) becomes $$M = \frac{1}{m_x} m_a \tilde{m}_b^T = \frac{1}{m_x} M'$$

and after substitution into (4):

$$M' = G^{-1} m_x N H = G^{-1} N' H \quad (6)$$

In contrast to the normal chain transfer matrix, the matrix N' is also defined for non-transmitting two-ports or for double one-ports. It is designated a pseudo-chain transfer matrix.

For the first standard ST1, for which transmission is a precondition, (4) can now be used, and for the second standard ST2 and the third standard ST3, (6) can be used:

$$M1 = G^{-1} N1 H \quad (7)$$

$$M2' = G^{-1} N2' H \quad (8)$$

$$M3' = G^{-1} N3' H \quad (9)$$

Equation (7) solved for H and inserted into (8) gives:

$$GM2'M1^{-1} = N2'N1^{-1}G \quad (10)$$

Using the matrix comprising only measurement values, $$Q = M2'M1^{-1}$$

Equation (10) becomes $$GQ = N2'N1^{-1}G \quad (11)$$

Equation (11) is a similarity transformation. In general, for two similar matrices $X_1$ and $X_2$ $$GX_1 = X_2 G$$

the following relations apply for trace and determinant:

$$sp(X_1) = sp(X_2) \quad (12)$$

$$det(X_1) = det(X_2) \quad (13)$$

The trace sp(X) of a matrix X is defined as the sum of the main diagonal elements.

For the pseudo-chain transfer matrix of the second standard ST2, with $$S2_{m21} = \frac{S2_{21}}{m_{2x}} \text{ and} \quad (14)$$

-continued $$S2_{m12} = m_{2x}S2_{12} \qquad (15)$$

the result is $$N2' = \frac{1}{S2_{m21}}\begin{pmatrix} S2_{m12}S2_{m12} - S2_{11}S_{2}22 & S2_{11} \\ -S2_{22} & 1 \end{pmatrix} \qquad (16)$$

Using the inverse chain transfer matrix of the first standard ST1

$$N1^{-1} = \frac{1}{S1_{12}}\begin{pmatrix} 1 & -S1_{11} \\ -S1_{22} & S1_{12}S1_{21} - S1_{11}S1_{22} \end{pmatrix} \qquad (17)$$

Equation (12) and (13) become $$sp(Q) = \frac{1}{S2_{m21}S1_{12}} \qquad (18)$$
$$(S2_{m12}S2_{m21} - S2_{11}S2_{22} + S2_{11}S1_{22} + S2_{22}S1_{11} - \det(S1))$$

$$S2_{m12} = \frac{S1_{12}}{S1_{21}}\det(Q)S2_{m21} \qquad (19)$$

inserting (19) into (18) gives $$S2_{m21} = \frac{S1_{12}sp(Q)}{2\det(Q)} - \sqrt{\frac{S1_{21}^2 sp(Q)^2}{4\det(Q)^2} + \frac{S1_{21}}{S1_{12}\det(Q)}(\det(S1) - S1_{11}S2_{22} - S1_{22}S2_{11} + S2_{11}S2_{22})} \qquad (20)$$

Using (14), (15) and (19), the unknown scattering parameters $S2_{12}$ and $S2_{21}$ in (20) can be determined. Self-calibration of the second standard ST2 is therefore complete.

Analogous to (16), for the third standard ST3, for which reflection symmetry, i.e. $S3_{11}=S3_{22}=r$, is a precondition:

$$N3' = \frac{1}{S3_{m31}}\begin{pmatrix} S3_{m12}S3_{m21} - r^2 & r \\ -r & 1 \end{pmatrix} \qquad (21)$$

$S3_{m12}$ and $S3_{m21}$ are defined in similar manner as in (14) and (15).

If $V=M3'M1^{-1}$, then analogous to (11):

$$GV=N3'N1^{-1}G \qquad (22)$$

applies.

Thus it follows from the trace and determinant equations (12) and (13):

$$sp(V) = \frac{S3_{m12}S3_{m21} - r^2 + r(S1_{11} + S1_{22}) - \det(S1)}{S3_{m21}S1_{12}} \qquad (23)$$

$$S3_{m12} = \frac{S1_{12}}{S1_{21}}\det(V)S3_{m21} \qquad (24)$$

Equation (24) inserted into (23) and solved for $S3_{m21}$ gives:

$$S3_{m21} = \frac{-r^2 + r(S1_{11} + S1_{22}) - \det(S1)}{sp(V)S1_{12}} \qquad (25)$$

Since (25) still contains the unknown r, a further condition is necessary. Combining equations (11) and (22) produces a third similarity transformation:

$$GQV=N2'N1^{-1}N3'N1^{-1}G$$

Whereas the use of (13) provides no further information than (19) and (24), using (12) results in a further very complex equation for $S3_{m21}$, dependent upon r. Without any restriction on universality, the third standard ST3 is now assumed to be transmission-free, which reduces the complexity of the calculation. S3 ml can be eliminated by equating it to (25), whereby a quadratic equation for r results:

$$ar^2+br+c=0 \qquad (26)$$

with the substitutions $$a = \frac{S1_{11}S2_{22} - S1_{11}S2_{22} - S1_{22}S2_{11} + S2_{11}S2_{22} - S2_{m12}S2_{m21}}{S2_{m21}S1_{12}^2 sp(QV)} + \frac{1}{sp(V)S1_{12}} \qquad (27)$$

$$b = \frac{(S2_{m12}S2_{m21} - \det(S1) + S1_{11}S2_{22} + S1_{11}S2_{22} + S1_{22}S2_{11} - S2_{11}S2_{22})sp(S1)}{S2_{m21}S1_{12}^2 sp(QV)} - \frac{S1_{12}S1_{21}sp(S2)}{S2_{m21}S1_{12}^2 sp(QV)} - \frac{sp(S1)}{S1_{12}sp(V)} \qquad (28)$$

$$c = \frac{S1_{11}S2_{22}(\det(S1) - S1_{11}S2_{22} - S1_{22}S2_{11} + S2_{11}S2_{22} - S2_{m12}S2_{m21})}{S2_{m21}S1_{12}^2 sp(QV)} \qquad (29)$$

Of the reflection factor r, which is a priori unknown, at least the phase must be approximately known in order that the correct one of the two solutions to (26) may be selected. Then all the scattering parameters of the third standard ST3 may be determined with (25) and (24) and the relations equivalent to (14) and (15). Now all the parameters of all three standards ST1, ST2 and ST3 are known.

From Equations (1) and (2) and the definition equation for scattering parameters, by elimination of the wave quantities, the following relation can be derived:

$$\begin{pmatrix} G_{11}m_1 + G_{12}m_2 & G_{11}m'_1 + G_{12}m'_2 \\ m_3 + H_{22}m_4 & m'_3 + H_{22}m'_4 \end{pmatrix} = \quad (30)$$

$$S \begin{pmatrix} G_{21}m_1 + G_{22}m_2 & G_{21}m'_1 + G_{22}m'_2 \\ H_{11}m_3 + H_{12}m_4 & H_{11}m'_3 + H_{12}m'_4 \end{pmatrix}$$

This matrix equation produces, for a two-port standard shown schematically at the top in FIG. 4, four, and for a double one-port standard shown at bottom in FIG. 4, two one-dimensional linear equations. For the 3 standards ST1-ST3, the result is therefore up to 12 equations, of which only 8 are usable, however. These comprise an overdetermined equation system, from which with the aid of an least squares solution, the system errors $G_{ij}$ and $H_{ij}$ can be found (see [Euk, Schiek]).

The above description of the method according to the invention relates to measurement of two-ports, but is not restricted thereto. In similar manner to DE 199 18 964 A1, it may also be used for multiport measurement in a network analyzer having more than two test ports MT. For this purpose, initially two test ports are calibrated as described above. Then, an as yet uncalibrated test port is firstly connected to an already calibrated test port via the same three standards ST1-ST3 and the calibration method is successively repeated until all the test ports are calibrated.

While the present invention has been described in connection with a number of embodiments and implementations, the present invention is not so limited but covers various obvious modifications and equivalent arrangements, which fall within the purview of the appended claims.

What is claimed is:

1. A method for calibrating a network analyzer having at least two measuring ports, comprising the steps of:
measuring a predetermined transmitting first calibration standard designed as a two-port standard and connected between two test ports of the network analyzer;
measuring a second calibration standard, designed as a two-port standard or a double one-port standard and connected between the two test ports of the network analyzer wherein only reflection parameters of the second standard are predetermined;
measuring a third standard that is symmetrical with regard to its reflection parameters and designed as a two-port standard or a double one-port standard and is connected between the two test ports of the network analyzer; and
calculating matrix elements of error two-ports assigned to the test ports based on results of said measuring the first, second and third calibration standards,
wherein reflection parameters of the first calibration standard and of the second calibration standard have any, but known, non-zero values and reflection parameter of the third calibration standard is non-zero, but is unknown.

2. A method according to claim 1, wherein unknown scattering parameters $S2_{12}$ and $S2_{21}$ of the second calibration standard are calculated using following equation system, wherein Q represents a matrix exclusively comprising measured values; det(Q) represents a determinant of the matrix Q; sp(Q) represents a spur of the matrix Q; $m_{2x}$ represents a determinant of a matrix consisting of measured values; $S1_{11}$, $S1_{12}$, $S1_{21}$, and $S1_{22}$ represent known scattering parameters of a matrix S1 of the first calibration standard; det(S1) represents a determinant of the matrix S1; $S2_{m12}$ and $S2_{m21}$ represent modified scattering parameters of the second calibration standard; and $S2_{11}$ and $S2_{22}$ represent the known reflection parameters of the second calibration standard:

$$S2_{m21} = \frac{S2_{21}}{m_{2x}}$$

$$S2_{m12} = m_{2x} S2_{12}$$

$$S2_{m12} = \frac{S1_{12}}{S1_{21}} \det(Q) S2_{m21}$$

$$S1 = S1_{11}S1_{22} - S1_{12}S1_{21}$$

$$S2_{m21} = \frac{S1_{12} sp(Q)}{2\det(Q)} - $$

$$\sqrt{\frac{S1_{21}^2 sp(Q)^2}{4\det(Q)^2} + \frac{S1_{21}}{S1_{12}\det(Q)}(\det(S1) - S1_{11}S2_{22} - S1_{22}S2_{11} + S2_{11}S2_{22})}$$

3. A method according to claim 2, wherein the unknown reflection parameter $r=S3_{11}=S3_{22}$ of the third calibration standard is determined by solution of following quadratic equation, wherein Q and V each represent a matrix composed exclusively of measured values, sp(V) represents a spur of matrix V, sp(QV) represents a spur of the multiplied matrixes Q and V:

$$ar^2 + br + c = 0 \text{ where}$$

$$a = \frac{S1_{11}S1_{22} - S1_{11}S2_{22} - S1_{22}S2_{11} + S2_{11}S2_{22} - S2_{m12}S2_{m21}}{S2_{m21}S1_{12}^2 sp(QV)} + \frac{1}{sp(V)S1_{12}},$$

$$b = \frac{(S2_{m12}S2_{m21} - \det(S1) + S1_{11}S2_{22} + S1_{11}S2_{22} + S1_{22}S2_{11} - S2_{11}S2_{22})sp(S1)}{S2_{m21}S1_{12}^2 sp(QV)} - $$

$$\frac{S1_{12}S1_{21}sp(S2)}{S2_{m21}S1_{12}^2 sp(QV)} - \frac{sp(S1)}{S1_{12}sp(V)}$$

$$c = \frac{S1_{11}S1_{22}(\det(S1) - S1_{11}S2_{22} - S1_{22}S2_{11} + S2_{11}S2_{22} - S2_{m12}S2_{m21})}{S2_{m21}S1_{12}^2 sp(QV)}.$$

4. A method according to claim 1, wherein the network analyzer has more than two test ports, whereby initially only two test ports are calibrated and then, in each case, one as yet uncalibrated test port is linked to an already calibrated test port via said three calibration standards and the calibration method is successively repeated until all the test ports have been calibrated.

* * * * *